(12) United States Patent
Hisaka

(10) Patent No.: US 7,402,887 B2
(45) Date of Patent: Jul. 22, 2008

(54) SEMICONDUCTOR DEVICE HAVING FUSE AREA SURROUNDED BY PROTECTION MEANS

(75) Inventor: Katsuhiro Hisaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 119 days.

(21) Appl. No.: 11/082,900

(22) Filed: Mar. 18, 2005

(65) Prior Publication Data

US 2006/0054992 A1  Mar. 16, 2006

(30) Foreign Application Priority Data

Sep. 13, 2004  (JP)  ............................. 2004-264836

(51) Int. Cl.
  *H01L 23/62* (2006.01)
(52) U.S. Cl. ...................... 257/529; 257/173; 257/209; 257/E23.149; 438/132; 438/215; 438/281
(58) Field of Classification Search ................ 257/529, 257/209, 173, E23.149; 438/132, 601, 215, 438/281
  See application file for complete search history.

(56) References Cited

U.S. PATENT DOCUMENTS

| | | | |
|---|---|---|---|
| 4,723,155 A | * | 2/1988 | Uchida ........................ 257/529 |
| 6,046,488 A | * | 4/2000 | Kawasaki et al. ............ 257/529 |
| 6,373,120 B1 | * | 4/2002 | Oiyama ........................ 257/529 |
| 6,933,591 B1 | * | 8/2005 | Sidhu et al. .................. 257/665 |
| 7,180,154 B2 | * | 2/2007 | Cho et al. .................... 257/529 |
| 2003/0116820 A1 | * | 6/2003 | Daubenspeck et al. ...... 257/529 |
| 2004/0038458 A1 | * | 2/2004 | Marr ........................... 438/132 |

FOREIGN PATENT DOCUMENTS

| | | | |
|---|---|---|---|
| JP | 11-67054 | | 3/1999 |
| JP | 11-067054 | * | 9/1999 |
| JP | 3526853 | | 2/2004 |

* cited by examiner

*Primary Examiner*—David Vu
*Assistant Examiner*—Earl N Taylor
(74) *Attorney, Agent, or Firm*—Rabin & Berdo, PC

(57) ABSTRACT

A semiconductor device has a semiconductor substrate, first and second insulating layers, a fuse, a diffusion layer and a conductive pattern. The first insulating layer is selectively formed on a surface of the semiconductor substrate. The fuse is formed on the first insulating layer. The diffusion layer is formed on the surface of the semiconductor substrate. The diffusion layer is applied to a fixed potential. The second insulating layer is formed on the fuse. The conductive pattern is formed on the second insulating layer. The conductive pattern surrounds the fuse. Further, the conductive pattern is electrically connected to the diffusion layer.

23 Claims, 4 Drawing Sheets

SEMICONDUCTOR DEVICE HAVING FUSE AREA SURROUNDED BY PROTECTION MEANS

BACKGROUND OF THE INVENTION

The present invention relates to a semiconductor device, and particularly to a semiconductor device having fuses for modifying electrical failures of the semiconductor device.

It is difficult to find electric failures or detective conditions generated in a manufacturing process of a semiconductor device (LSI) such as a memory during its manufacturing process. They become clear in an electric testing process executed after the manufacturing process. Therefore, the LSI is provided with at least one redundant fuse to modify the electric failures. The electric failures found out in the electric testing process can be modified by cutting and processing (fuse blow) the fuse with laser light.

The redundant fuse is formed, using a polysilicon layer, on a field insulating film formed on the surface of a semiconductor substrate and is covered with an insulating film as shown in, for example, a patent document 1 (Japanese Unexamined Patent Publication No. Hei 11(1999)-67054). Upon cutting of the fuse, it is cut by laser light together with the insulating film. Thus, a cut section of the fuse is exposed to the outside within a fuse aperture or opening during from after the cutting of the fuse to resin encapsulation.

In a scribing process executed during from after the cutting of the fuse to the resin encapsulation, the cut section of the fuse is subjected to charged water. When ESD (Electro Static Discharge) occurs in this state, there is a possibility that an electrical charge will pass from the charged water to the fuse cut section and a gate electrode of an internal transistor to thereby cause breakdown of a gate insulating film of the internal transistor. There is also a possibility that even by an electrical charge charged on a film with a chip mounted thereon, it will be discharged from the fuse cut section to the gate electrode of the internal transistor, thereby causing the breakdown of the gate insulating film.

A protection circuit that protects an internal circuit of a semiconductor device has been described in, for example, a patent document 2 (Japanese Patent Application No. 3526853). This internal circuit is connected to a ground potential terminal (high potential side) and a low voltage source terminal (low potential side) and operated at a negative potential. The protection circuit comprises a first diode connected between a ground voltage source terminal and an input terminal and operated in the backward direction where a negative polarity surge has occurred in the input terminal, a second diode connected between the input terminal and the low potential source terminal and operated in the forward direction where the negative polarity surge has occurred in the input terminal, an NMOS transistor connected between a substrate potential terminal and the low voltage source terminal, and first and second capacitors which divide the difference in potential between the substrate potential terminal and the low voltage source terminal and applies a source-to-gate voltage to the NMOS transistor. The respective capacitances of the first and second capacitors are selected in such a manner that the source-to-gate voltage of the NMOS transistor does not cause turning-on thereof over its threshold value in the normal case free of the electrostatic surge. Since a backward electrostatic surge current flows in the first diode where the negative polarity surge is intruded into the input terminal, a response time is taken and the electrostatic surge responds in the forward direction of the second diode, so that the electrostatic surge current flows from the second diode to the input terminal. The difference in potential between the substrate potential terminal and the low voltage source terminal becomes approximately identical to the voltage of the electrostatic surge. Thus, the gate-to-source voltage of the NMOS transistor, which is divided by the first and second capacitors, exceeds the threshold value so that the NMOS transistor is turned ON. Therefore, the electrostatic surge current flows through the substrate potential terminal, the NMOS transistor and the second diode so that the internal circuit is protected from the electrostatic surge.

As described above, the redundant fuse of the semiconductor device has the cut section exposed to the outside in the scribing process or the like subsequent to having been cut by, for example, laser. Therefore, there is a fear that the gate insulating film of the transistor of the internal circuit will be broken due to the electrical charge intruded from the cut section. Although, however, measures against the ESD surge intruded from the input terminal such as described in the patent document 2 have heretofore been taken, any measures are not taken against the ESD surge at the cut section of the redundant fuse.

SUMMARY OF THE INVENTION

The present invention is directed to a semiconductor device having a fuse and a protection means surrounding the fuse. According to the aspect of the present invention, a semiconductor device has a semiconductor substrate, first and second insulating layers, a fuse, a diffusion layer and a conductive pattern. The first insulating layer is selectively formed on a surface of the semiconductor substrate. The fuse is formed on the first insulating layer. The diffusion layer is formed on the surface of the semiconductor substrate. The diffusion layer is applied to a fixed potential. The second insulating layer is formed on the fuse. The conductive pattern is formed on the second insulating layer. The conductive pattern surrounds the fuse. Further, the conductive pattern is electrically connected to the diffusion layer.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention S will hereinafter be described with reference to the accompanying drawings.

First Preferred Embodiment

Figure 1:
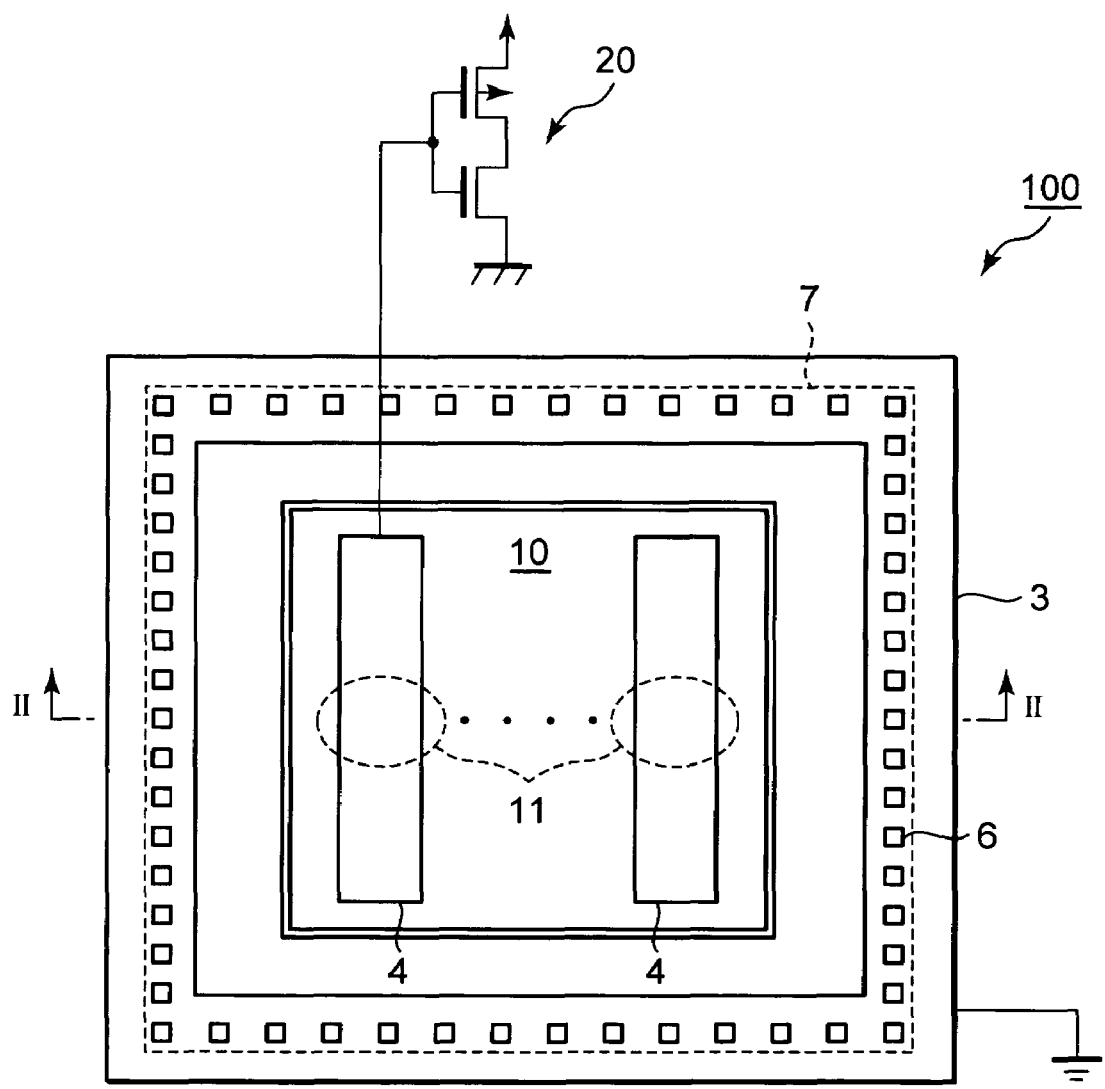
FIG. 1 is a plan view showing the neighborhood of redundant fuses of a semiconductor device according to a first embodiment.
Figure 2:
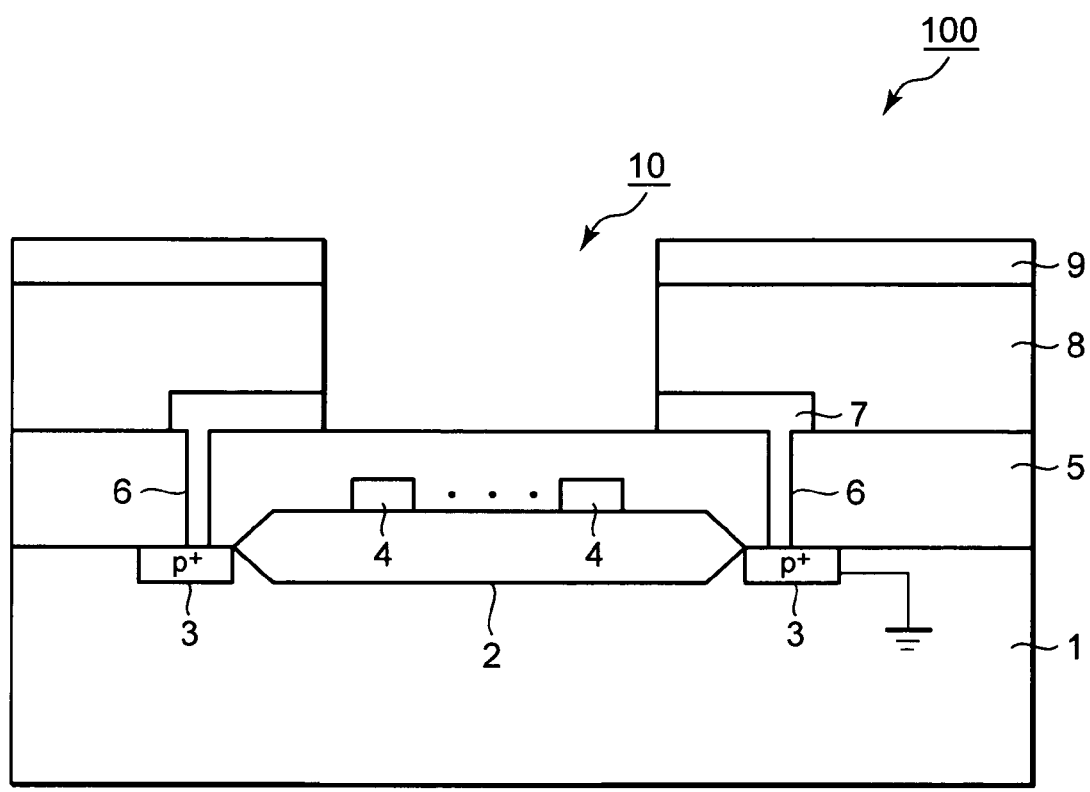
FIG. 2 is a cross-sectional view taken along line II-II of FIG. 1.

FIG. 1 is a pattern diagram showing the neighborhood of redundant fuses of a semiconductor device 100 according to a first embodiment of the present invention. FIG. 2 is a plan view taken along line II-II of FIG. 1.

The semiconductor device 100 is equipped with a P-type semiconductor substrate 1, a field insulating film 2, a P+ diffusion layer 3, fuses 4, an insulating film 5, a conductive film 7, an insulating film 8 and a protection film 9.

The P-type semiconductor substrate 1 is of a substrate added with P and As corresponding to P-type impurities. The semiconductor substrate 1 is placed on a stage in a state of a wafer and identical in potential to the stage. Although the semiconductor substrate 1 is placed on the stage with a film interposed therebetween in a scribing process to be described later, it is identical in potential to the stage because the film is very thin and the capacitance between the wafer and the stage is very large. The field insulating film 2 is of an insulating film such as an oxide film formed in a predetermined region of the P-type semiconductor substrate 1 by LOCOS, STI or the like. The P+ diffusion layer 3 is formed in a region (active region) unformed with the field insulating film 2 at the surface of the P-type semiconductor substrate 1.

The P+ diffusion layer 3 is of a diffusion layer formed by adding B or the like corresponding to a P-type impurity to a predetermined region of the active region in a high concentration. As shown in FIG. 1, the P+ diffusion layer 3 is formed in a loop so as to surround the conductive film 7 and overlaps with a peripheral edge portion of the conductive film 7. The P+ diffusion layer 3 is electrically connected to a substrate potential.

The fuses 4 are formed in a predetermined region on the field insulating film 2. Each of the fuses 4 is formed of a polysilicon film or a multilayer film of polysilicon and high melting point silicide (eutectic film of a high melting point metal such as tungsten, molybdenum, titanium or the like, and silicon) by a sputtering method. The fuses 4 are electrically connected to transistors 20 of an internal circuit. The fuses 4 are of redundant fuses for modifying electric failures or defective conditions of the semiconductor device 100. Depending on the electric failures found out in an electric testing process, they are cut and processed (fuse-blown) at trimming points 11 of FIG. 1 by a laser beam together with the insulating film 5.

The insulating film 5 is formed on the semiconductor substrate 1 so as to cover the fuses 4. The insulating film 5 is of a BPSG film ($SiO_2$ film doped with phosphorus or boron) or a multilayer film of both $SiO_2$ film and BPSG film, which is formed by a CVD method using, for example, $SiH_4$ gas. Apertures 6 for exposing the P+ diffusion-layer 3 are defined in the insulating film 5.

The conductive film 7 is formed of tungsten W in a layer formed with a first layer metal wiring (1M). The conductive film 7 is shaped on the insulating film 5 above the fuses 4 in the form of a substantially rectangular island. In order to define or form an aperture 10 to be described later, the conductive film 7 serves as an etching stopper film upon etching the insulating film 8 and the protection film 9. The conductive film 7 is formed so as to be a size larger than the aperture 10. After the etching of the insulating film 8 and the protection film 9, the conductive film 7 remaining in the aperture 10 is removed by etching. As a result, the conductive film 7 is shaped such that its peripheral edge portion remains in a loop as shown in FIG. 1. Each cross section of the conductive film 7 is exposed within the aperture 10 as shown in FIG. 2. Also the conductive film 7 is formed even within the apertures 6 and electrically connected to the P+ diffusion layer 3 through the apertures 6.

The insulating film 8 and the protection film 9 are formed over the insulating film 5 so as to cover the conductive film 7. The aperture 10 for opening portions above the fuses 4 is formed in the conductive film 7 and the insulating films 8 and 9. In the present semiconductor device 100, the conductive film 7 and the P+ diffusion layer 3 constitute an ESD protection circuit with respect to the redundant fuses. That is, since each cross section of the conductive film 7 is exposed to within the aperture 10 and connected to the substrate potential through the P+ diffusion layer 3, an electrical charge intruded into the aperture 10 is discharged from the corresponding cross section of the conductive film 7 to the substrate potential through the P+ diffusion layer 3 without being via a fuse cut section. More specifically, the electrical charge intruded from the conductive film 7 is discharged from the ring-shaped P+ diffusion layer 3 to the P-type semiconductor substrate located directly therebelow. That is, the electrical charge intruded from the conductive film 7 is diffused over a wide range through the ring-shaped P+ diffusion layer 3 to thereby make it possible to discharge the electrical charge charged in the conductive film 7 rapidly. Thus, the electrical charge intruded into the aperture 10 can be electrostatically charged in the conductive film 7 without being charged in the corresponding fuse 4 and discharged to the substrate potential rapidly. Incidentally, if a plurality of P+ diffusion layers 3 are provided as in the case where a second P+ diffusion layer is further provided so as to cover the P+ diffusion layer 3 and a third P+ diffusion layer is provided so as to cover the second P+ diffusion layer, then the electrical charge charged in the conductive film 7 can be discharged more rapidly.

In the semiconductor device 100, the scribing process is performed in a state in which the fuse cut section is being exposed within the aperture 10. Even though electrostatically charged water enters into the aperture 10, an electrical charge from the electrostatically charged water is discharged from the corresponding cross section of the conductive film 7 to the substrate potential through the P+ diffusion layer 3 without being via the fuse cut section. It is thus possible to prevent an ESD surge from occurring in the fuse cut section and protect a gate insulating film for the transistors 20 of the internal circuit, which are connected to the corresponding fuse 4. Even though an electrical charge is intruded into the aperture 10 from a charged film upon picking up a chip placed on the film after the scribing process, the electrical charge can be discharged via the conductive film 7 and the P+ diffusion layer 3.

The conductive film 7 that constitutes the ESD protection circuit is used as a stopper film for the insulating films 8 and 9 and thereafter disposed so as to surround the periphery of the aperture 10 for opening the portions above the fuses 4. Therefore, this leads to ESD protection measures against a plurality of the fuses 4 exposed within the aperture 10. That is, the process of forming the ESD protection circuit is simple as compared with the case in which the ESD protection circuits are provided every respective fuses of the plurality of fuses, and the area necessary to form the ESD protection circuit can also be prevented from increasing.

Figure 3:
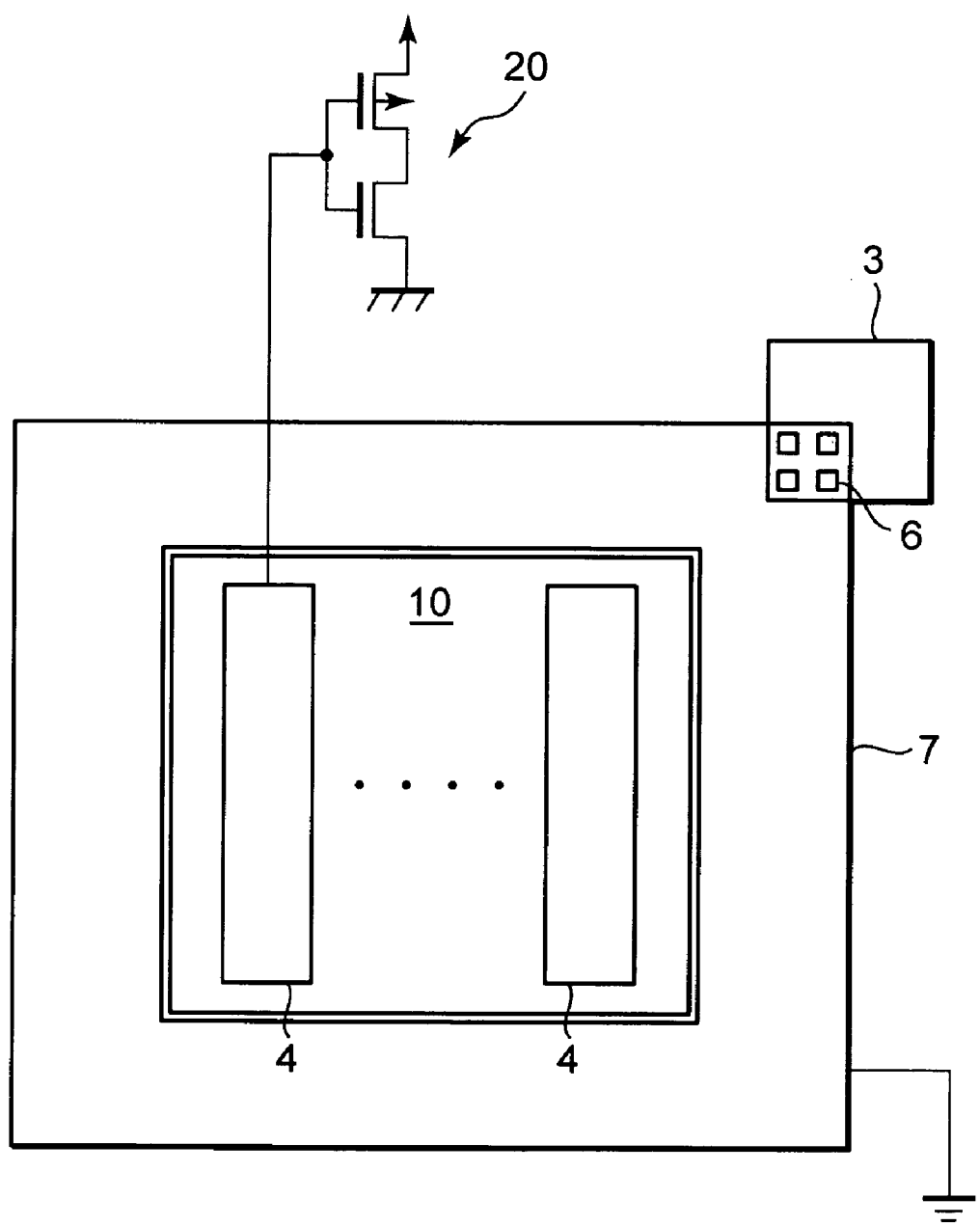
FIG. 3 is a plan view illustrating the neighborhood of redundant fuses of a semiconductor device according to a modification.

Preferred Modification (a) Although the P+ diffusion layer 3 is formed so as to surround the conductive film 7 in the above, the P+ diffusion layer 3 may overlap with only part of the peripheral edge portion of the conductive film 7 as shown in FIG. 3. In such an example as shown in FIG. 3, the P+ diffusion layer 3 is formed so as to be superposed on one corner of the conductive film 7. Even in this case, the P+ diffusion layer 3 and the conductive film 7 are electrically connected each other through apertures 6 defined in an insulating film 5.

(b) Incidentally, although the conductive film 7 has been formed using W in the above, it may be constituted using a metal such as aluminum, an alloy film (Al alloy film) composed principally of aluminum, or polysilicon, or a multilayer film of polysilicon and high melting point silicide (eutectic film of a high melting point metal such as tungsten, molybdenum, titanium or the like, and silicon).

(c) Although the conductive film 7 is directly connected to the P+ diffusion layer 3 via the apertures 6 defined in the insulating film 5 in the above, the form of connection between the conductive film 7 and the P+ diffusion layer 3 is not limited to it if the conductive film 7 is eventually connected to the substrate potential. If, for example, such a configuration that the conductive film 7 is led out or drawn through a metal wiring or a polysilicon wring and eventually connected to the substrate potential, is taken, then operations and effects similar to the above configuration can be brought about.

Second Preferred Embodiment

Figure 4:
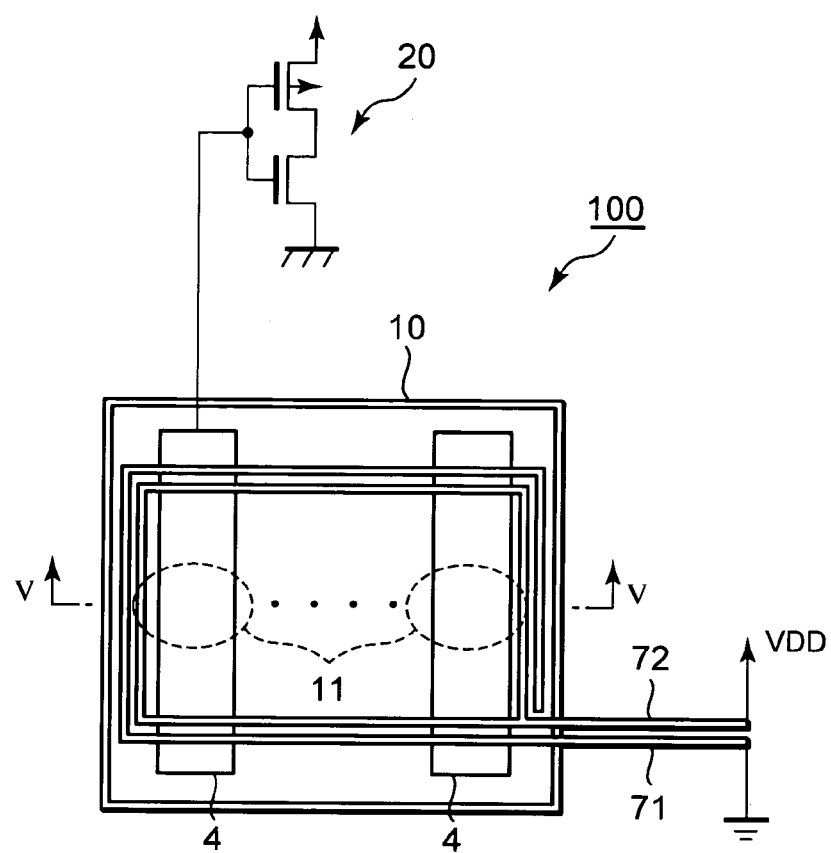
FIG. 4 is a plan view depicting the neighborhood of redundant fuses of a semiconductor device according to a second embodiment.
Figure 5:
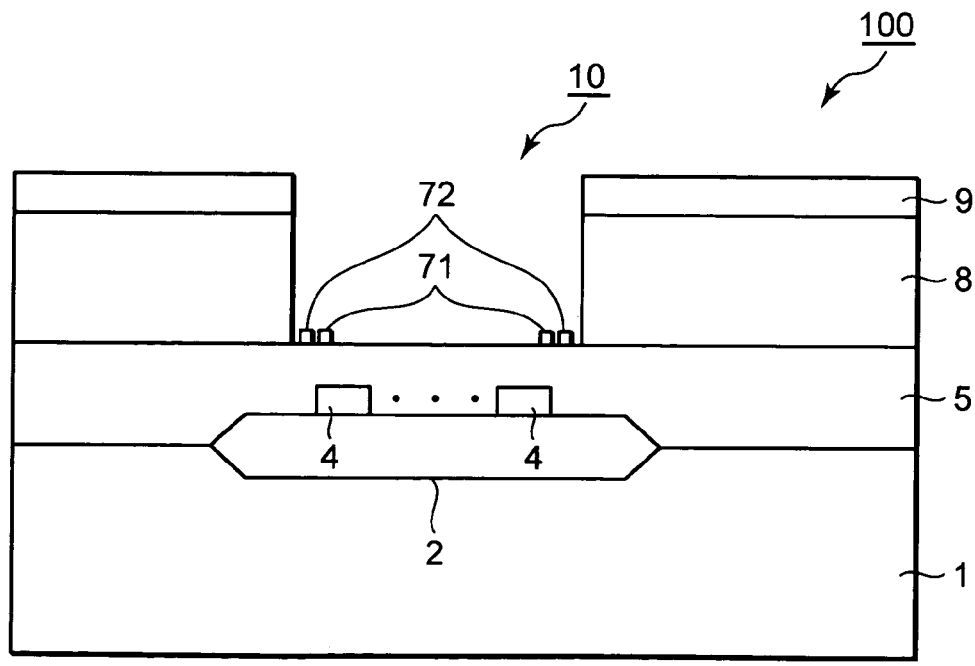
FIG. 5 is a plan view taken along line V-V of FIG. 4.

FIG. 4 is a plan view showing the neighborhood of redundant fuses of a semiconductor device 100 according to a second embodiment. FIG. 5 is a cross-sectional view taken along line V-V of FIG. 4.

In the present embodiment, conductive films 71 and 72, which form loops over a plurality of fuses 4, are formed on an insulating film 5 located within an aperture 10. The conductive films 71 and 72 are formed of tungsten W in a layer formed with a first layer metal wiring (1M). One end of the conductive film 71 is electrically connected to a substrate potential, whereas one end of the conductive film 72 is electrically connected to a source or power supply potential VDD. The fuses 4 are cut at trimming points 11 by laser as shown in FIG. 4.

In the present semiconductor device 100, the conductive film 71 electrically connected to the substrate potential and the conductive film 72 electrically connected to the source potential VDD constitute an ESD protection circuit. That is, although a fuse cut section is exposed to within the aperture 10 when the corresponding fuse 4 is cut by laser, an electrical charge intruded into the aperture 10 is discharged to the substrate potential and the power supply potential VDD through the conductive films 71 and 72 respectively.

In the semiconductor device 100, a scribing process is performed in a state in which the fuse cut section is being exposed within the aperture 10. Even though electrostatically charged water enters into the aperture 10, an electrical charge from the electrostatically charged water is discharged to the substrate potential and the power supply potential VDD through the conductive films 71 and 72 without being via the fuse cut section. It is thus possible to prevent an ESD surge from occurring in the fuse cut section and protect a gate insulating film for transistors 20 of an internal circuit, which are connected to the corresponding fuse 4. Even though an electrical charge is intruded into the aperture 10 from a charged film upon picking up a chip placed on the film after the scribing process, the electrical charge can be discharged via the conductive films 71 and 72.

Since the conductive films 71 and 72 that constitute the ESD protection circuit, are provided so as to be common to the plurality of fuses 4 in the aperture 10, they lead to ESD protection measures against the plurality of fuses 4. That is, the process of forming the ESD protection circuit is simple as compared with the case in which the ESD protection circuits are provided every respective fuses of the plurality of fuses, and the area necessary to form the ESD protection circuit can also be prevented from increasing.

Although the conductive films 71 and 72 have been formed using W in the above, they may be constituted using a metal such as aluminum, an alloy film (Al alloy film) composed principally of aluminum, or polysilicon, or a multilayer film of polysilicon and high melting point silicide (eutectic film of a high melting point metal such as tungsten, molybdenum, titanium or the like, and silicon).

What is claimed is:

1. A semiconductor device comprising:
   a semiconductor substrate having a surface thereof;
   a first insulating layer selectively formed in direct contact with the surface of the semiconductor substrate;
   a fuse formed in direct contact with the first insulating layer;
   a diffusion layer formed in direct contact with the surface of the semiconductor substrate, the diffusion layer being applied to a fixed potential;
   a second insulating layer formed in direct contact with the fuse;
   a conductive pattern formed in direct contact with the second insulating layer, the conductive pattern surrounding the fuse and being electrically connected to the diffusion layer; and
   a third insulating layer formed in direct contact with the second insulating layer and the conductive pattern, the third insulating layer having a window to expose both the second insulating layer over the fuse and a part of the conductive pattern, wherein no portion of the conductive pattern except a peripheral edge portion thereof is exposed in the window.

2. The semiconductor device according to claim 1, wherein the diffusion layer surrounds the fuse.

3. The semiconductor device according to claim 1, wherein the fuse is formed of polysilicon.

4. The semiconductor device according to claim 1, wherein the fixed potential is the ground potential.

5. The semiconductor device according to claim 1, wherein the diffusion layer is located under the conductive pattern.

6. The semiconductor device according to claim 1, wherein conductivity types of the semiconductor substrate and the diffusion layer are identical.

7. The semiconductor device according to claim 1, wherein the conductive pattern is made of metal.

8. A semiconductor device comprising:
   a semiconductor substrate having a surface thereof;
   a first insulating layer selectively formed in direct contact with the surface of the semiconductor substrate;
   a fuse formed in direct contact with the first insulating layer;
   a second insulating layer formed in direct contact with the fuse;
   a first conductive pattern formed in direct contact with the second insulating layer, the first conductive pattern surrounding the fuse;
   a connection between the first conductive pattern and a source of a first fixed potential; and
   a third insulating layer formed in direct contact with the second insulating layer, the third insulating layer having a window for exposing the second insulating layer over the fuse;
   wherein the first conductive pattern is formed within the window, and wherein no portion of the conductive pattern except a peripheral edge portion thereof is exposed in the window.

9. The semiconductor device according to claim 8, wherein the fuse is formed of polysilicon.

10. The semiconductor device according to claim 8, wherein the first fixed potential is the ground potential.

11. The semiconductor device according to claim 8, wherein the first conductive pattern is made of metal.

12. The semiconductor device according to claim 8, further comprising a second conductive pattern formed on the second insulating layer, the second conductive pattern surrounding the fuse and being applied to a second fixed potential.

13. The semiconductor device according to claim 12, wherein the second fixed potential is a voltage supply potential.

14. The semiconductor device according to claim 12, wherein the second conductive pattern is made of metal.

15. A semiconductor device comprising:
a semiconductor substrate having a surface thereof;
a field oxide layer selectively formed in direct contact with the surface of the semiconductor substrate;
a fuse formed in direct contact with the field oxide layer;
a diffusion layer formed in direct contact with the surface of the semiconductor substrate, the diffusion layer being applied to a fixed potential;
a first insulating layer formed in direct contact with the fuse;
a conductive pattern formed in direct contact with the first insulating layer, the conductive pattern surrounding the fuse and being electrically connected to the diffusion layer; and
a second insulating layer formed in direct contact with the first insulating layer, the second insulating layer having a window to expose the first insulating layer over the fuse;
wherein the conductive pattern is formed inside the window, and
wherein no portion of the conductive pattern except a peripheral edge portion thereof is exposed in the window.

16. The semiconductor device according to claim 15, wherein the conductive pattern is formed along an outside of the window.

17. The semiconductor device according to claim 8, wherein the connection comprises means for applying the first fixed potential to the first conductive pattern.

18. A semiconductor device comprising:
a semiconductor substrate having a surface thereof;
a field oxide layer selectively formed in direct contact with the surface of the semiconductor substrate;
a fuse formed in direct contact with the field oxide layer;
a diffusion layer formed in direct contact with the surface of the semiconductor substrate, the diffusion layer being applied to a fixed potential;
a first insulating layer formed in direct contact with the fuse;
a conductive pattern formed in direct contact with the first insulating layer, the conductive pattern being electrically connected to the diffusion layer; and
a second insulating layer formed in direct contact with the first insulating layer, the second insulating layer having a window to expose the first insulating layer over the fuse and to expose a part of the conductive pattern;
wherein no portion of the conductive pattern except a peripheral edge portion thereof is exposed in the window.

19. The semiconductor device according to claim 18, wherein the fuse is formed of polysilicon.

20. The semiconductor device according to claim 18, wherein the fixed potential is the ground potential.

21. The semiconductor device according to claim 18, wherein the diffusion layer is located under the conductive pattern.

22. The semiconductor device according to claim 18, wherein conductivity types of the semiconductor substrate and the diffusion layer are identical.

23. The semiconductor device according to claim 12, wherein the second conductive pattern is formed within the window.

* * * * *